(12) United States Patent
Teranishi

(10) Patent No.: US 10,348,399 B2
(45) Date of Patent: Jul. 9, 2019

(54) OPTICAL TRANSMITTER DEVICE

(71) Applicant: SUMITOMO ELECTRIC DEVICE INNOVATIONS, INC., Yokohama-shi, Kanagawa (JP)

(72) Inventor: Ryota Teranishi, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 16/035,211

(22) Filed: Jul. 13, 2018

(65) Prior Publication Data

US 2019/0028189 A1    Jan. 24, 2019

(30) Foreign Application Priority Data

Jul. 21, 2017    (JP) .................. 2017-141862

(51) Int. Cl.
| | | |
|---|---|---|
| H01L 35/32 | (2006.01) | |
| H04B 10/50 | (2013.01) | |
| H04B 10/032 | (2013.01) | |
| H01L 35/30 | (2006.01) | |

(52) U.S. Cl.
CPC ......... *H04B 10/032* (2013.01); *H01L 35/30* (2013.01); *H01L 35/32* (2013.01); *H04B 10/503* (2013.01)

(58) Field of Classification Search
CPC ..... H04B 10/032; H04B 10/503; H01L 35/30; H01L 35/32
USPC ........................................................ 398/192
See application file for complete search history.

(56) References Cited

U.S. PATENT DOCUMENTS

| | | | | |
|---|---|---|---|---|
| 8,186,892 B2* | 5/2012 | Hosking | ............. | G02B 6/4201 361/831 |
| 8,774,568 B2* | 7/2014 | Han | .................... | G02B 6/4206 385/14 |
| 2008/0276624 A1* | 11/2008 | Morimoto | ............... | F25B 21/02 62/3.7 |
| 2013/0272649 A1* | 10/2013 | Braunisch | ............... | G02B 6/12 385/14 |

FOREIGN PATENT DOCUMENTS

JP    05-327031    12/1993

* cited by examiner

*Primary Examiner* — Dalzid E Singh
(74) *Attorney, Agent, or Firm* — Smith, Gambrell & Russell, LLP.

(57) ABSTRACT

An optical transmitter device is disclosed. The optical transmitter device includes an optical integrating device, a carrier, and a thermo-electric cooler (TEC). The carrier has a top surface and a back surface opposite to the top surface. The carrier includes an insulating slab and a metal plate attached to the insulating slab. The metal plate has thermal conductivity better than thermal conductivity of the insulating slab. The insulating slab forms the top surface of the carrier that provides an interconnection thereon. The back surface mounts the optical integrating device thereon. The TEC faces the carrier and mounts the carrier thereon. The carrier has a base overlapped with the TEC and an extension not overlapped with the TEC, the extension mounting the optical integrating device thereon.

13 Claims, 19 Drawing Sheets

Fig.4
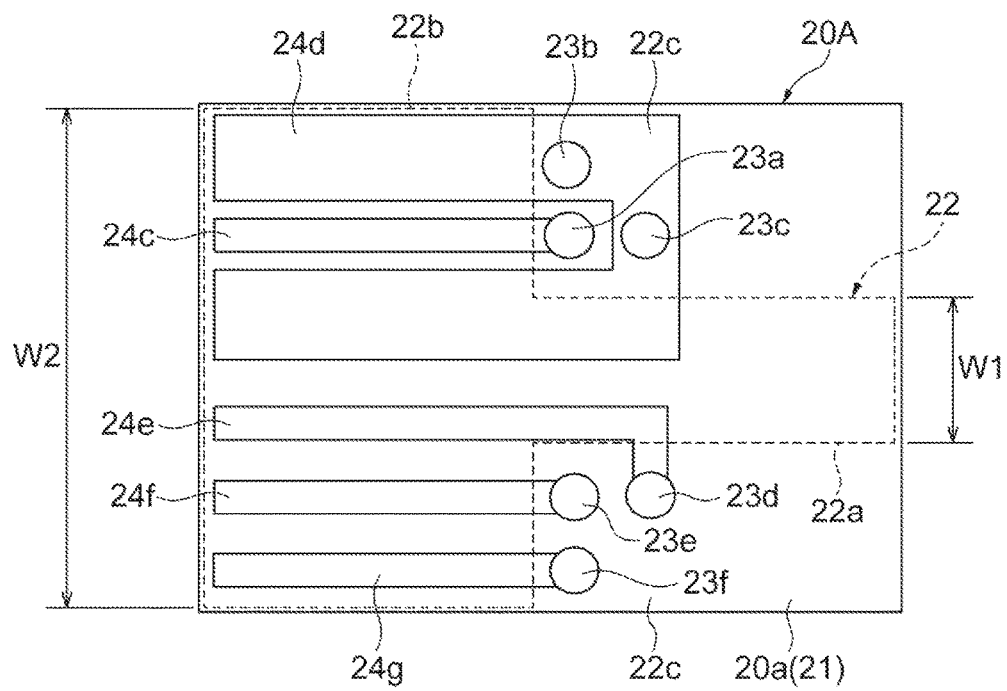
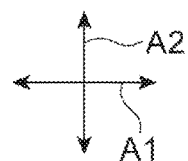

OPTICAL TRANSMITTER DEVICE

CROSS-REFERENCE TO RELATED APPLICATION

The present application claims the benefit of priority of Japanese Patent Application No. 2017-141862, filed on Jul. 21, 2017, the content of which is incorporated herein by reference in its entirety.

TECHNICAL FIELD

The present invention relates to an optical transmitter device.

BACKGROUND OF INVENTION

Japanese Unexamined Patent Publication No. JP-H5-327031 discloses an optical semiconductor module. This optical semiconductor module includes a laser diode, a thermoelement, and a mount substrate contained in a housing unit. The mount substrate mounts the laser diode on one surface thereof. The thermoelement is disposed between the other surface of the mount substrate and the bottom surface of the housing.

SUMMARY OF INVENTION

This disclosure provides an optical transmitter device. The optical transmitter device comprises an optical integrating device, a carrier, and a thermo-electric cooler (TEC). The carrier has a top surface and a back surface opposite to the top surface. The carrier includes an insulating slab and a metal plate attached to the insulating slab. The metal plate has thermal conductivity better than thermal conductivity of the insulating slab. The insulating slab forms the top surface of the carrier that provides an interconnection thereon. The back surface mounts the optical integrating device thereon. The TEC faces the carrier and mounts the carrier thereon. The carrier has a base overlapped with the TEC and an extension not overlapped with the TEC, the extension mounting the optical integrating device thereon.

BRIEF DESCRIPTION OF THE DRAWINGS

The foregoing and other purposes, aspects and advantages will be better understood from the following detailed description of a preferred embodiment of the invention with reference to the drawings, in which:

FIG. 4 is a top view showing the configuration viewed from the top surface of the carrier;

DETAILED DESCRIPTION

Figure 1:
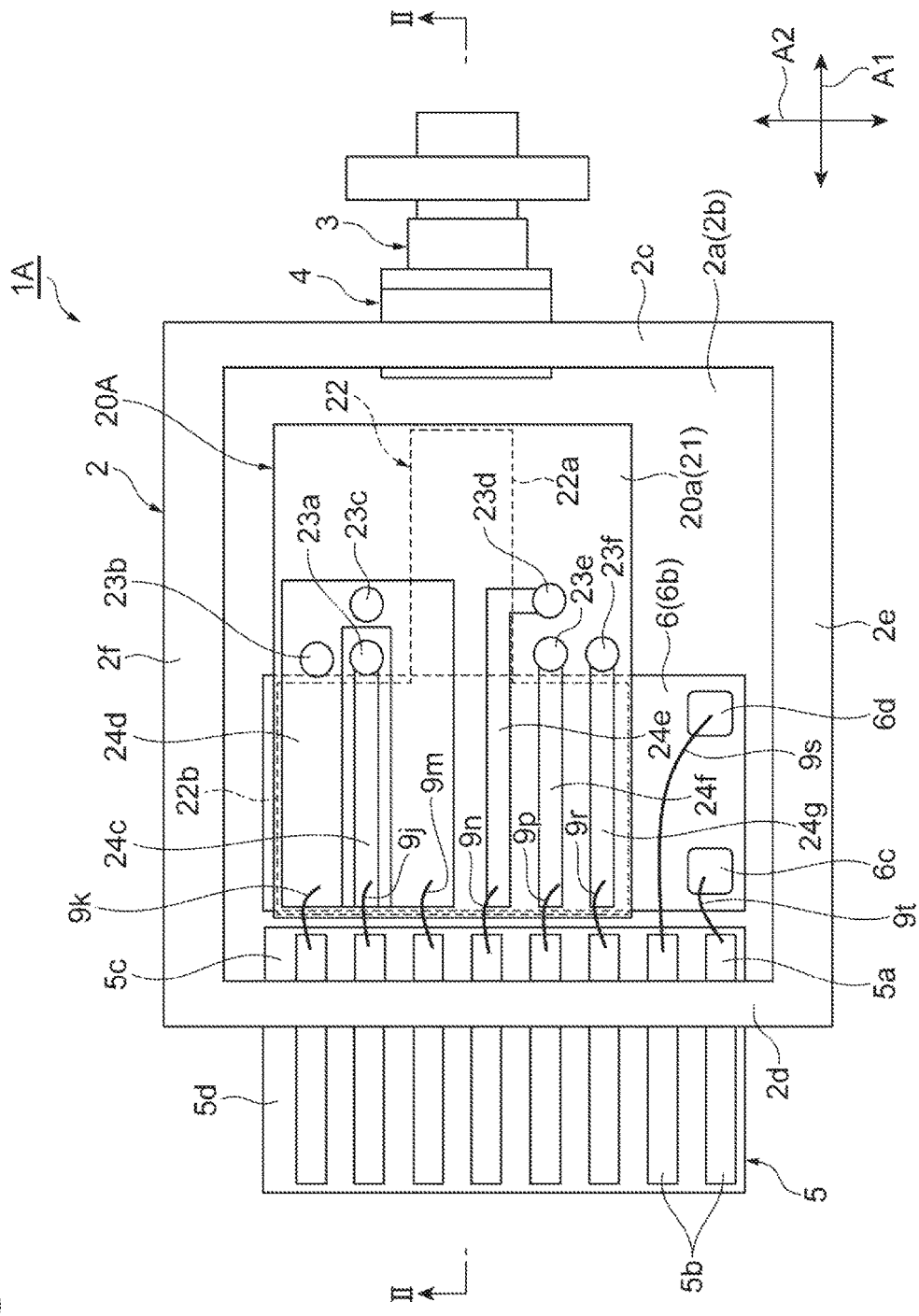
FIG. 1 is a top view of an optical transmitter device according to one embodiment of the present invention.

Problems to be Solved by the Present Disclosure

An optical communications system uses an optical transmitter device containing an optical integrating device. Upon input of an electrical modulation signal to this optical transmitter device, this modulation signal actuates an optical integrating device and makes the device output an optical signal. The optical transmitter device uses a thermo-electric cooler, such as a Peltier device to control the temperature of the optical integrating device. In general, a conventional optical transmitter device mounts a carrier (mount substrate) on a thermo-electric cooler, and mounts an optical integrating device on the carrier. However, with such a configuration, it is difficult to make the height of the optical transmitter device (the length of the optical transmitter device in the thickness direction of the carrier) small. Since recent optical communications systems require a reduction in device size with increasing volumes of data traffic, the height of the optical transmitter device is also required to be made small.

Effect of the Present Disclosure

The optical transmitter device according to the present disclosure can downside the height of the optical transmitter device.

Description of Embodiment of the Present Invention

First, the contents of an embodiment of the present invention will be listed and described. An optical transmitter device to one embodiment of the present invention comprises an optical integrating device, a carrier, and a thermo-electric cooler (TEC). The carrier has a top surface and a back surface opposite to the top surface. The carrier includes an insulating slab and a metal plate attached to the insulating slab. The metal plate has thermal conductivity better than thermal conductivity of the insulating slab. The insulating slab forms the top surface of the carrier that provides an interconnection thereon. The back surface mounts the optical integrating device thereon. The TEC faces the carrier and mounts the carrier thereon. The carrier has a base overlapped with the TEC and an extension not overlapped with the TEC, the extension mounting the optical integrating device thereon.

The optical integrating device may have an optical axis along which the extension extends from the base. The extension may have a width narrower than a width of the base, where the width of the extension and the width of the base are measured along a direction perpendicular to the optical axis. The optical transmitter device may further comprise a housing that encloses the optical integrating device and the carrier therein. The carrier may provide an end opposite to the base thereof, the end being fixed with the housing through a locker.

The base may include a stein and two branches each extending from the stein, the extension being put between the two branches. The carrier may provide a via that electrically connects the interconnection in the top surface thereof with the optical integrating device in the back surface. The metal plate may be removed in a portion providing the via. The metal plate may form the back surface of the carrier. The back surface of the carrier may mount the optical integrating device through a chip carrier. The chip carrier may mount a capacitor, a terminator, and a thermistor thereon.

The carrier may further provide another insulating slab attached to the metal plate, the insulating slab and the another insulating slab sandwiching the metal plate, the another insulating slab being attached to the TEC and forming the back surface of the carrier. Another insulating slab may provide another interconnection thereon. The carrier may further provide an auxiliary area except for the base and the extension, the auxiliary area providing a via that electrically connects the interconnection on the top surface of the carrier with the another interconnection on the back surface of the carrier.

The carrier may further mount a wiring substrate in the back surface thereof. The optical integrating device may be provided with a driving signal through the wiring substrate. The optical integrating device may include a semiconductor laser diode (LD) driven with a DC mode and a semiconductor modulator driven in an AC mode, the semiconductor modulator being integrated with the LD and driven by a driving signal carried on the interconnection on the top surface of the carrier. The top surface of the carrier may only mount the interconnection thereon.

Details of Embodiment of the Present Invention

A specific example of an optical transmitter device according to embodiments of the present invention will now be described with reference to the accompanying drawings. The present invention, however, is not restricted to those embodiments, and has a scope defined in claims and includes all changes, modifications and equivalents derived from the scope of the claims. In the description below, when drawings are explained, the same components are denoted by the same reference numeral and overlapping description will be omitted. In addition, in the description below, the direction along the optical axis L of an optical integrating device 11 (hereinafter simply referred to as "optical axis direction") is defined as a direction A1, the direction along the bottom surface 2b of a housing 2 and intersecting the optical axis direction is defined as a direction A2, and the direction perpendicular to the bottom surface 2b of the housing 2 is defined as a direction A3. In one example, these directions intersect at right angles.

Figure 2:
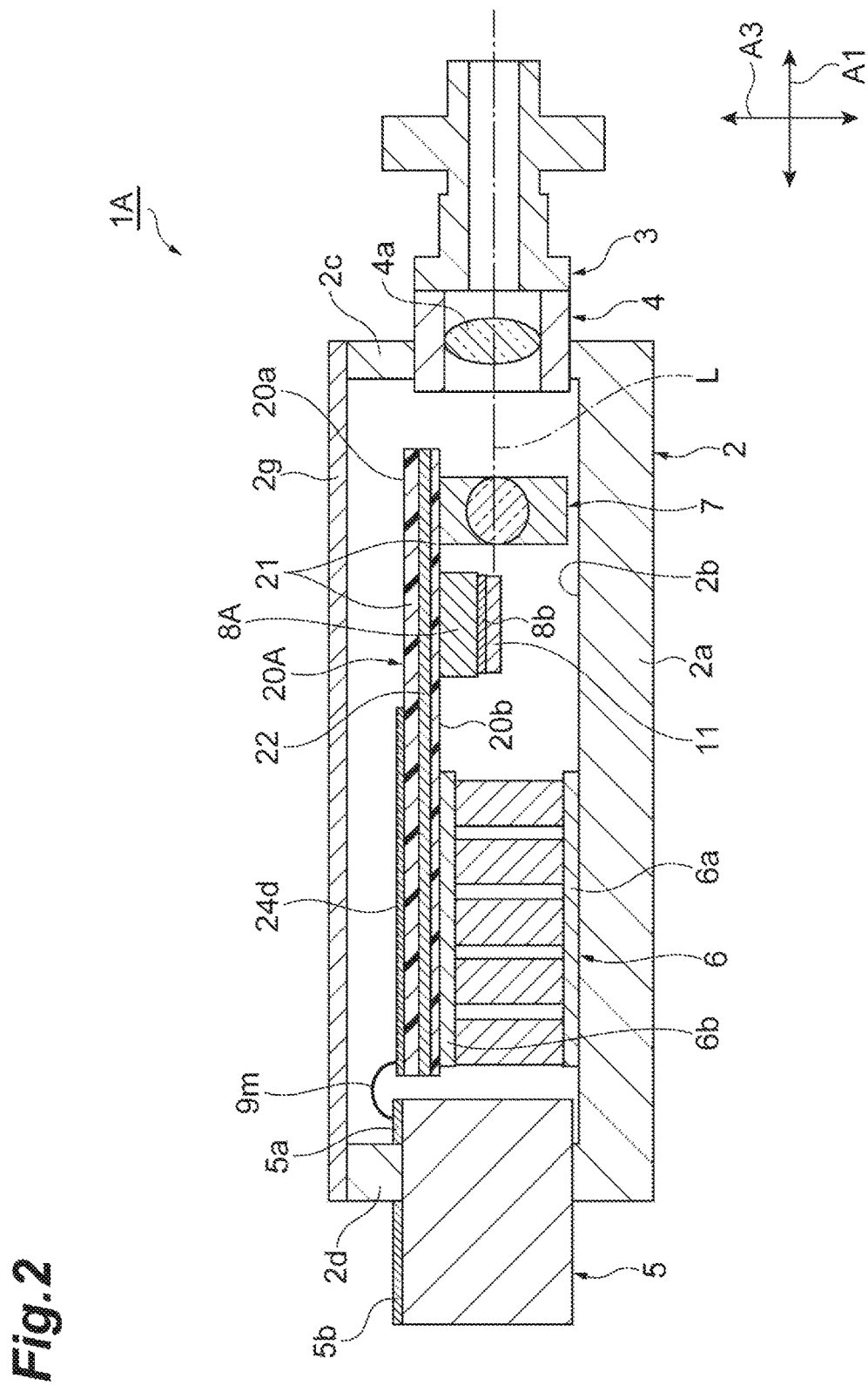
FIG. 2 is a sectional view of the optical transmitter device along line II-II of the optical transmitter device shown in FIG. 1.

FIG. 1 is a top view of an optical transmitter device 1A according to one embodiment of the present invention. FIG. 2 is a sectional view of the optical transmitter device 1A along line II-II of the optical transmitter device 1A shown in FIG. 1. As shown in FIGS. 1 and 2, the optical transmitter device 1A of this embodiment includes a housing 2, a thermo-electric cooler (TEC) 6, a lens 7, an optical integrating device 11, and a carrier 20A.

The housing 2 is a hollow container that contains the TEC 6, the lens 7, the optical integrating device 11, and the carrier 20A. The housing 2 is mainly composed of ceramic and a metal, such as CuW, for example. The length of the housing 2 along the direction A1 is, for example, in the range of 8 mm to 30 mm, the width of the housing 2 along the direction A2 is, for example, in the range of 5 mm to 15 mm, and the height of the housing 2 along the direction A3 is, for example, in the range of 2.5 mm to 6.0 mm. The housing 2 includes a base 2a, a front wall 2c, a rear wall 2d, a pair of side walls 2e and 2f, and a lid 2g. The base 2a is generally quadrilateral and has a thickness direction along the direction A3. The base 2a has a flat bottom surface 2b extending along the direction A1 and the direction A2. The front wall 2c and the rear wall 2d are provided to, among the four sides of the base 2a, a pair of sides opposite in the direction A1, and extend along the direction A3. The pair of side walls 2e and 2f is provided to, among the four sides of the base 2a, a pair of sides opposite in the direction A2, and extend along the direction A3. The lid 2g is joined to the ends of the front wall 2c, the rear wall 2d, and the pair of side walls 2e and 2f opposite to those adjacent to the base 2a, thereby sealing the internal space of the housing 2. The lid 2g is omitted in FIG. 1.

The front wall 2c has an opening passing therethrough in the direction A1 to let in laser light emerging from the optical integrating device 11, and a lens holder 4 resides in the opening. The lens holder 4 is, for example, a metal cylindrical member and connects the internal space of the housing 2 with the external space. The central axis of the lens holder 4 extends in the direction A1. The lens holder 4 contains and fixes the lens 4a, which condenses laser light, in the hole. The central axis of the cylinder of the lens holder 4 and the optical axis of the lens 4a are identical. A generally cylindrical coupling unit 3 is fixed to the front end surface of the lens holder 4, which is the end surface located outside the housing 2. The hole through the coupling unit 3 and the hole through the lens holder 4 are communicated with each other. The coupling unit 3 is coupled with an optical fiber which is not shown in the drawing. Laser light emerging from the optical integrating device 11 passes through the lens 4a and the coupling unit 3 and enters the optical fiber.

The rear wall 2d has another opening passing therethrough in the direction A1. A feedthrough 5 for communication of electric power and electrical signals between the interior and exterior of the housing 2 resides in this opening. The feedthrough 5 is a generally rectangular parallelepiped and has an inner surface 5c located inside the housing 2, and an outer surface 5d located outside the housing 2. The inner surface 5c and the outer surface 5d are flat surfaces extending in the direction A2. A plurality of terminals 5a is provided on the inner surface 5c. The plurality of terminals 5a is metal films extending in the direction A1 and arranged in the direction A2. A plurality of terminals 5b is provided on the outer surface 5d. The plurality of terminals 5b is metal films extending in the direction A1 and arranged in the direction A2. The plurality of terminals 5a and the plurality of terminals 5b are electrically connected to each other in the feedthrough 5.

The TEC 6 is provided on the bottom surface 2b of the housing 2 and is supported by the base 2a. The TEC 6 is a Peltier device, for example. The TEC 6 has a pair of bottom and top plates 6a and 6b and performs heat transfer between the pair of bottom and top plates 6a and 6b in response to drive current from an external device. One of the pair of bottom and top plates 6a and 6b (e.g. the bottom plate 6a) is thermally coupled to the base 2a and, in one example, is in contact with the bottom surface 2b. The other of the pair of bottom and top plates 6a and 6b (e.g. the top plate 6b) is thermally coupled to the carrier 20A and, in one example, is in contact with the back surface 20b of the carrier 20A. As shown in FIG. 1, the TEC 6 has two electrodes 6c and 6d. The electrodes 6c and 6d are electrically connected to two of the terminals 5a of the feedthrough 5, respectively, through bonding wires 9s and 9t. The TEC 6 is supplied with drive current through these terminals 5a, the bonding wires 9s and 9t, and the electrodes 6c and 6d.

The carrier 20A is a flat-plate member extending in the direction A1 and the direction A2 and having a thickness in the direction A3. The flat plate of the carrier 20A is quadrilateral, for example. The carrier 20A has a top surface 20a and a back surface 20b along the direction A1 and the direction A2. The back surface 20b is a surface adjacent to the TEC 6 and faces the bottom surface 2b. The top surface 20a is a surface remote from the TEC 6 and faces the lid 2g.

Figure 3:
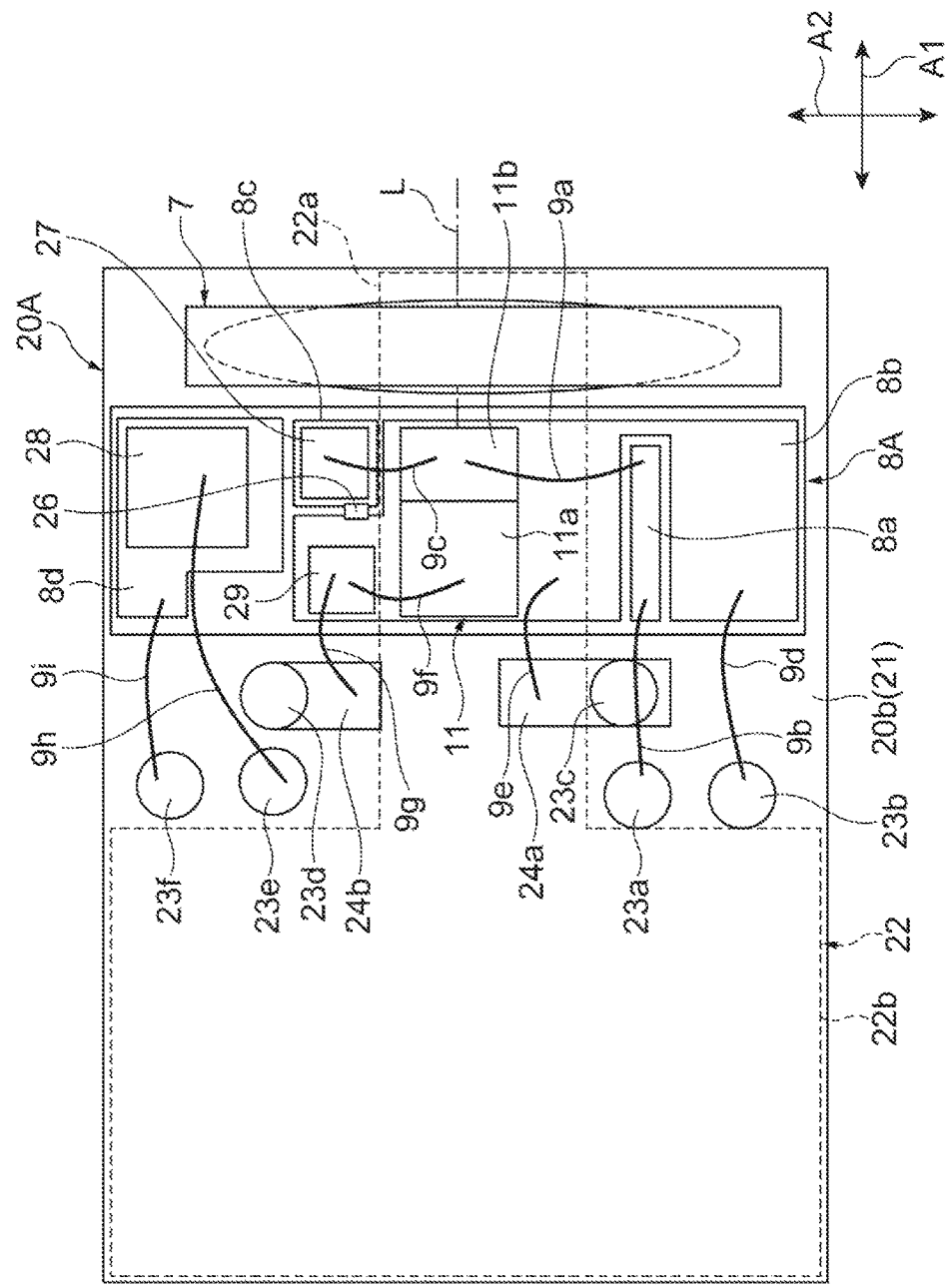
FIG. 3 is a bottom view showing the configuration viewed from the back surface of a carrier.

Here, FIG. 3 is a bottom view showing the configuration viewed from the back surface 20b of the carrier 20A. As shown in FIG. 3, a chip carrier 8A is disposed on the back surface 20b of the carrier 20A. The chip carrier 8A is a generally rectangular parallelepiped, is an insulating member, and has a longitudinal direction along the direction A2. In this embodiment, the chip carrier 8A is disposed adjacent to the front end of the carrier 20A (the end on the front wall 2c side). The chip carrier 8A mounts the optical integrating device 11, the capacitor 27, the thermistor 28, and the capacitor 29 on its main surface. The optical integrating device 11 of this embodiment is composed of a laser element 11a and a modulator element 11b monolithically integrated in the optical axis direction. Bias current is applied to the laser element 11a, which allows continuous light at a predetermined wavelength to be emitted. High-frequency modulation voltage is applied to the modulator element 11b, so that the continuous light is modulated and optical signals are generated.

A plurality of metal patterns 8a to 8d, which is metal films, is formed on the main surface of the chip carrier 8A. The metal pattern 8a is a signal transmission line for transmitting high-frequency signals and extends in the direction A1 in the region sandwiched between the metal pattern 8b, which is a reference potential (GND) pattern. One end of the metal pattern 8a is electrically connected to the top plate electrode of the modulator element 11b through a bonding wire 9a. The other end of the metal pattern 8a is electrically connected to a via 23a through a bonding wire 9b. The metal pattern 8b is electrically connected to a via 23b through a bonding wire 9d, and to a via 23c through a bonding wire 9e and an interconnection 24a formed on the back surface 20b. The bottom plate electrode of the modulator element 11b is conductive joined to the metal pattern 8b. The top plate electrode of the modulator element 11b is electrically connected to the top plate electrode of the capacitor 27, which is a terminating capacitor, through a bonding wire 9c. The bottom plate electrode of the capacitor 27 is conductive-joined to a metal pattern 8c. The metal pattern 8c is connected to the metal pattern 8b through a terminator 26.

The top plate electrode of the laser element 11a is electrically connected to the top plate electrode of the capacitor 29 through a bonding wire 9f. Further, the top plate electrode of the capacitor 29 is electrically connected to a via 23d through a bonding wire 9g and an interconnection 24b formed on the back surface 20b. The bottom plate electrode of the capacitor 29 is conductive-joined to the metal pattern 8b. The capacitor 29 serves as a high-frequency filtering capacitor used to stabilize bias current.

The top plate electrode of the thermistor 28 is electrically connected to a via 23e through a bonding wire 9h. The bottom plate electrode of the thermistor 28 is conductive joined to the metal pattern 8d. The metal pattern 8d is electrically connected to a via 23f through a bonding wire 9i. The thermistor 28 detects the temperature of the optical integrating device 11 by changing its resistance depending on the temperature of the optical integrating device 11. A temperature control circuit provided outside the optical transmitter device 1A adjusts the drive current to the TEC 6 such that the temperature of the optical integrating device 11 obtained through the thermistor 28 approaches a predetermined temperature.

The lens 7 is disposed on the back surface 20b of the carrier 20A. The lens 7 is disposed between the optical integrating device 11 and the lens holder 4 and on the optical axis L of the optical integrating device 11. The lens 7 collimates laser light emerging from the optical integrating device 11. Accordingly, collimated laser light is provided to the lens 4a of the lens holder 4.

FIG. 4 is a top view showing the configuration viewed from the top surface 20a of the carrier 20A. As shown in FIG. 4, interconnections 24c to 24g, which are metal films, are disposed on the top surface 20a of the carrier 20A. These interconnections 24c to 24g extend in the direction A1 from the respective vias 23a to 23f to the rear end of the carrier 20A (the end on the feedthrough 5 side). To be specific, the interconnection 24c extends in the direction A1 in the region sandwiched between the interconnection 24d, which is a signal wiring for transmitting high-frequency modulation signals to the optical integrating device 11 and is a reference potential (GND) pattern. The front end of the interconnection 24c is connected to the via 23a. The via 23a passes through between the top surface 20a and the back surface 20b, thereby establishing an electrical connection between the interconnection 24c and the modulator element 11b of the optical integrating device 11. The front end of the interconnection 24d is connected to the vias 23b and 23c passing through between the top surface 20a and the back surface 20b. The interconnection 24e is wiring for supplying bias current. The front end of the interconnection 24e is connected to the via 23d. The via 23d passes through between the top surface 20a and the back surface 20b, thereby establishing an electrical connection between the interconnection 24e and the laser element 11a of the optical integrating device 11. The interconnections 24f and 24g are wiring for transmitting signals from the thermistor 28. The front ends of the interconnections 24f and 24g are connected to the vias 23e and 23f, respectively. The vias 23e and 23f pass through between the top surface 20a and the back surface 20b, thereby establishing an electrical connection between each of the interconnections 24f and 24g and the thermistor 28.

As shown in FIG. 1, the rear end of the interconnection 24c is electrically connected to one of the plurality of terminals 5a of the feedthrough 5 through a bonding wire 9j. The rear end of the interconnection 24d is electrically connected to two of the plurality of terminals 5a of the feedthrough 5 through bonding wires 9k and 9m. The rear ends of the interconnections 24e to 24g are electrically connected to the respective terminals 5a of the feedthrough 5 through bonding wires 9n, 9p, and 9r, respectively.

As shown in FIG. 2, the carrier 20A includes insulating slabs 21 and a metal plate 22. The insulating slabs 21 are insulating plate-like members and constitute the top surface 20a and the back surface 20b, respectively. The insulating slabs 21 can be composed of a material, such as AlO or AlN. The heat-transfer coefficient of the insulating slabs 21 are 30 to 150 W/(m·K), for example. The metal plate 22 is composed of a material more thermally conductive than those for the insulating slabs 21 and is integrally provided with the insulating slabs 21. The metal plate 22 can be, for example, a metal plate composed of a metal, such as tungsten. The heat-transfer coefficient of the metal plate 22 is greater than or equal to 200 W/(m·K), for example. In this embodiment, the metal plate 22 is provided between the insulating slabs 21. The metal plate 22 is a plate extending along the top surface 20a and the back surface 20b and has a thickness of less than or equal to 1.0 mm, for example.

The metal plate 22 includes an extension 22a and a base 22b. As shown in FIG. 3, when viewed from the direction A3, the optical integrating device 11 and the extension 22a overlap with each other. In other words, the region where the optical integrating device 11 is projected toward the back surface 20b overlaps with the region where the extension 22a is projected toward the back surface 20b. Accordingly, the optical integrating device 11 is thermally bonded to the metal plate 22 at the extension 22a. The extension 22a may further overlap with the lens 7 when viewed from the direction A3. In addition, as shown in FIG. 1, when viewed from the direction A3, the TEC 6 and the base 22b overlap with each other. Accordingly, the TEC 6 is thermally bonded to the metal plate 22 at the base 22b. The extension 22a and the base 22b are arranged along the optical axis direction of the optical integrating device 11 (i.e., the direction A1). As shown in FIG. 4, the width W1 of the extension 22a in the direction A2 is smaller than the width W2 of the extension 22a in the same direction.

The vias 23a to 23f are provided in auxiliary areas 22c of the carrier 20A other than the region where the metal plate 22 is provided. In this embodiment, the vias 23a to 23c are provided on one side (on the side wall 2f side) of the extension 22a in the direction A2, and the vias 23d to 23f are provided on the other side (on the side wall 2e side) of the extension 22a in the direction A2. Accordingly, the vias 23a to 23f can be formed without interference from the metal plate 22.

Figure 5:
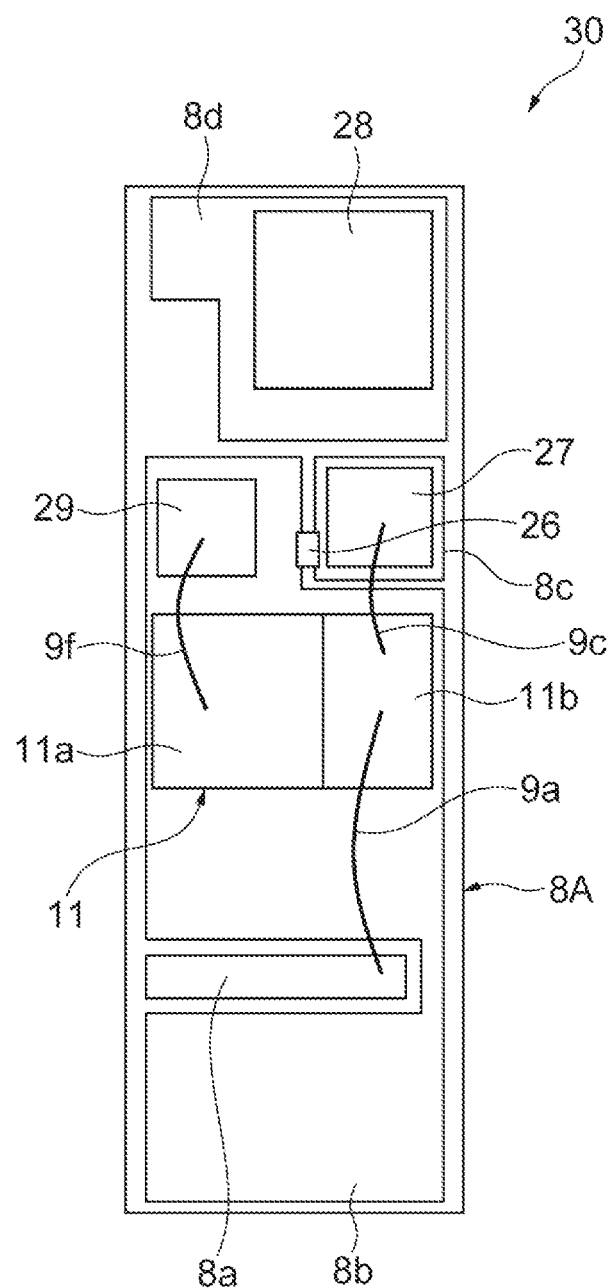
FIG. 5 is a diagram showing a method of assembling the optical transmitter device.

FIGS. 5 to 9 are diagrams showing a method of assembling the optical transmitter device 1A. A method of assembling the optical transmitter device 1A will now be described with reference to FIGS. 5 to 9. First, as shown in FIG. 5, a laser assembly 30 is assembled. In other words, the optical integrating device 11, the terminator 26, the capacitors 27 and 29, and the thermistor 28 are populated on the main surface of the chip carrier 8A on which the metal patterns 8a to 8d are formed. The bonding wires 9a, 9c, and 9f are then connected thereto.

Figure 6:
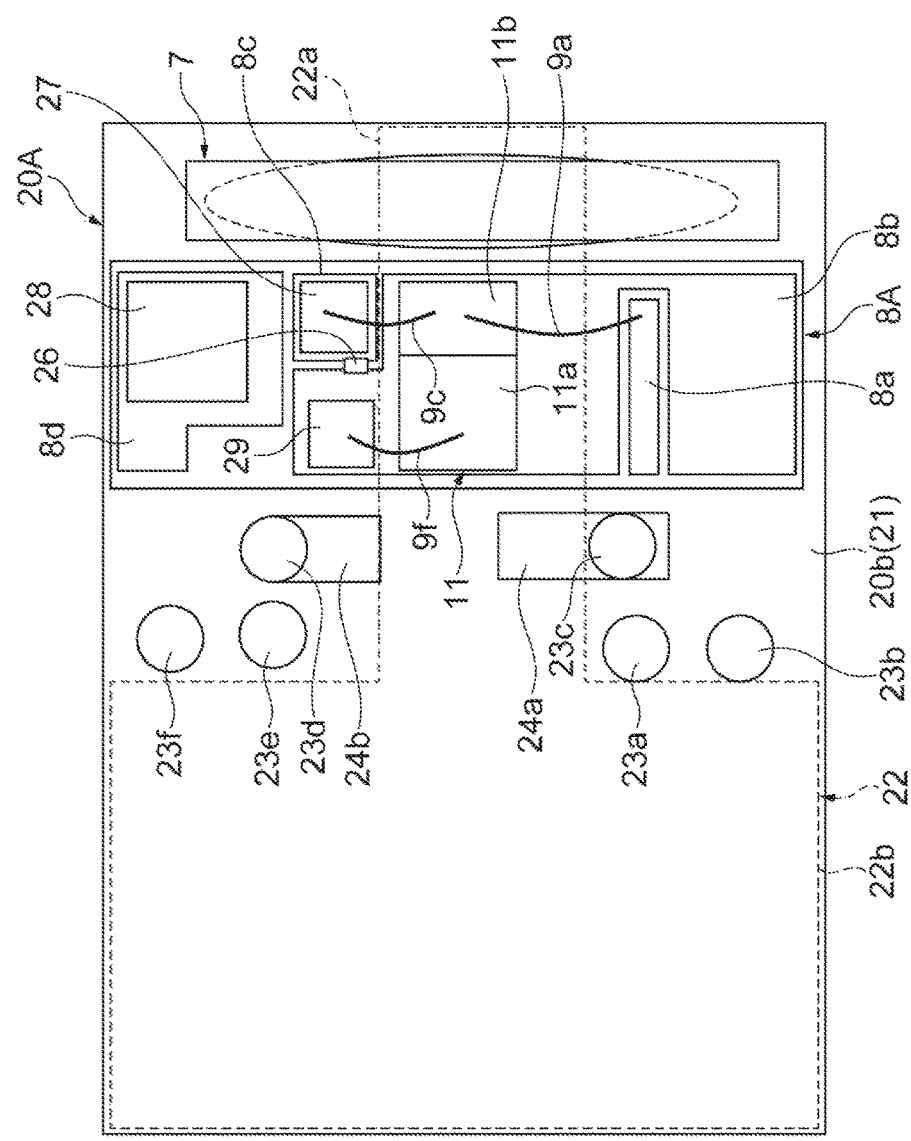
FIG. 6 is a diagram showing the method of assembling the optical transmitter device.
Figure 7:
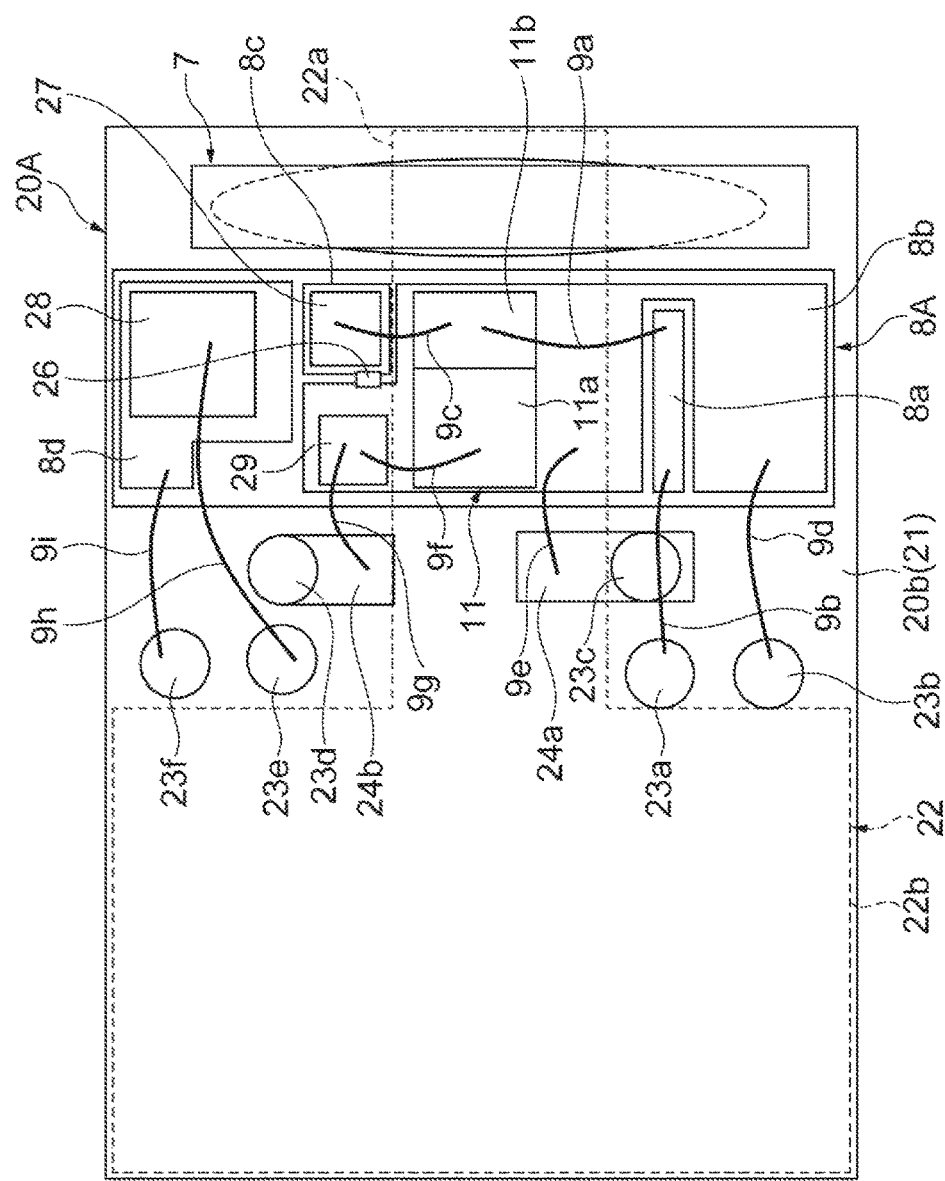
FIG. 7 is a diagram showing the method of assembling the optical transmitter device.

Next, as shown in FIG. 6, the lens 7 and the laser assembly 30 are mounted on the back surface 20b of the carrier 20A. A resin adhesive, for example, is used for fixation of the lens 7 and the laser assembly 30 to the back surface 20b. Subsequently, as shown in FIG. 7, the bonding wires 9b, 9d, 9e, 9g, 9h, and 9i are connected thereto.

Figure 8:
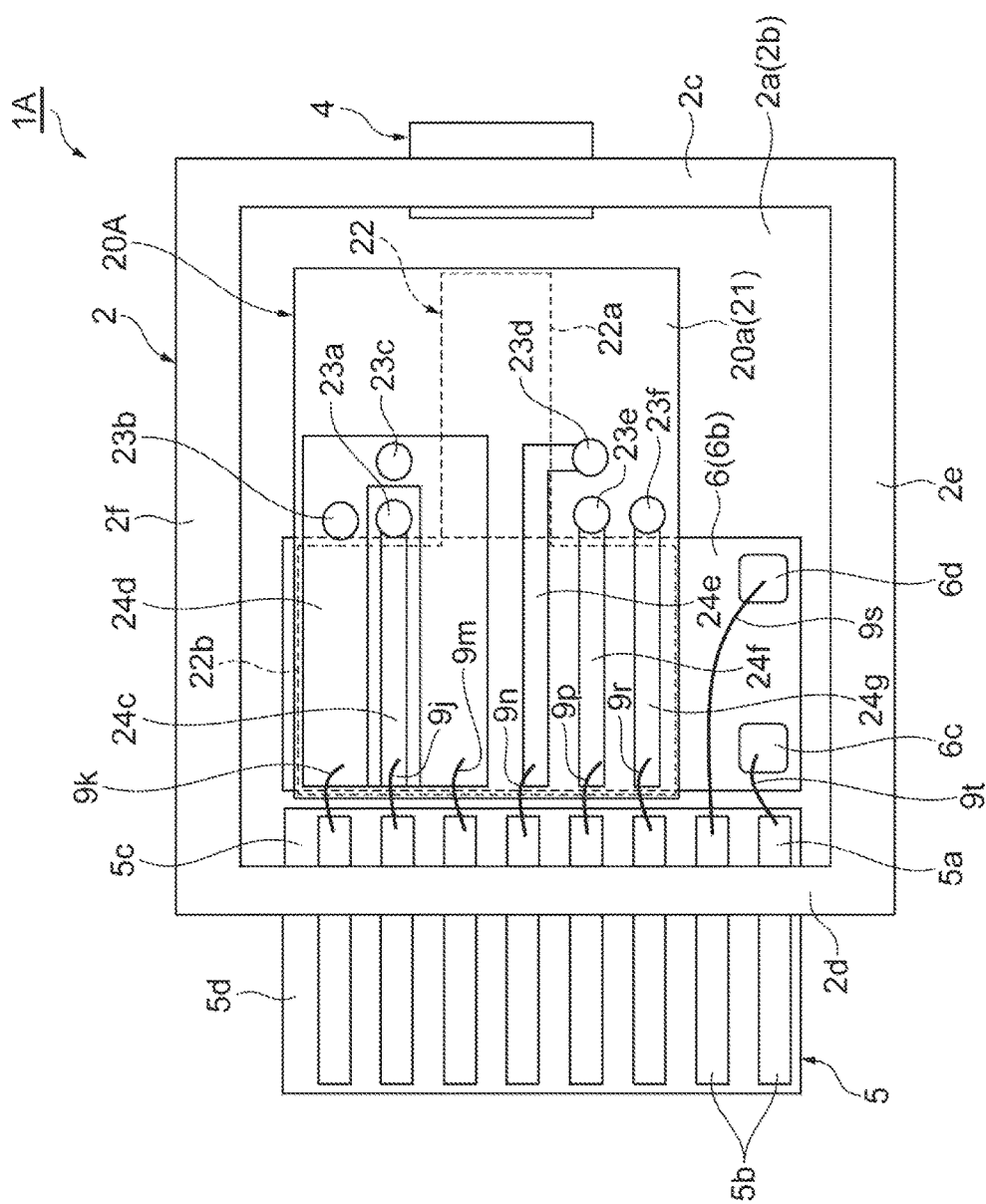
FIG. 8 is a diagram showing the method of assembling the optical transmitter device.
Figure 9:
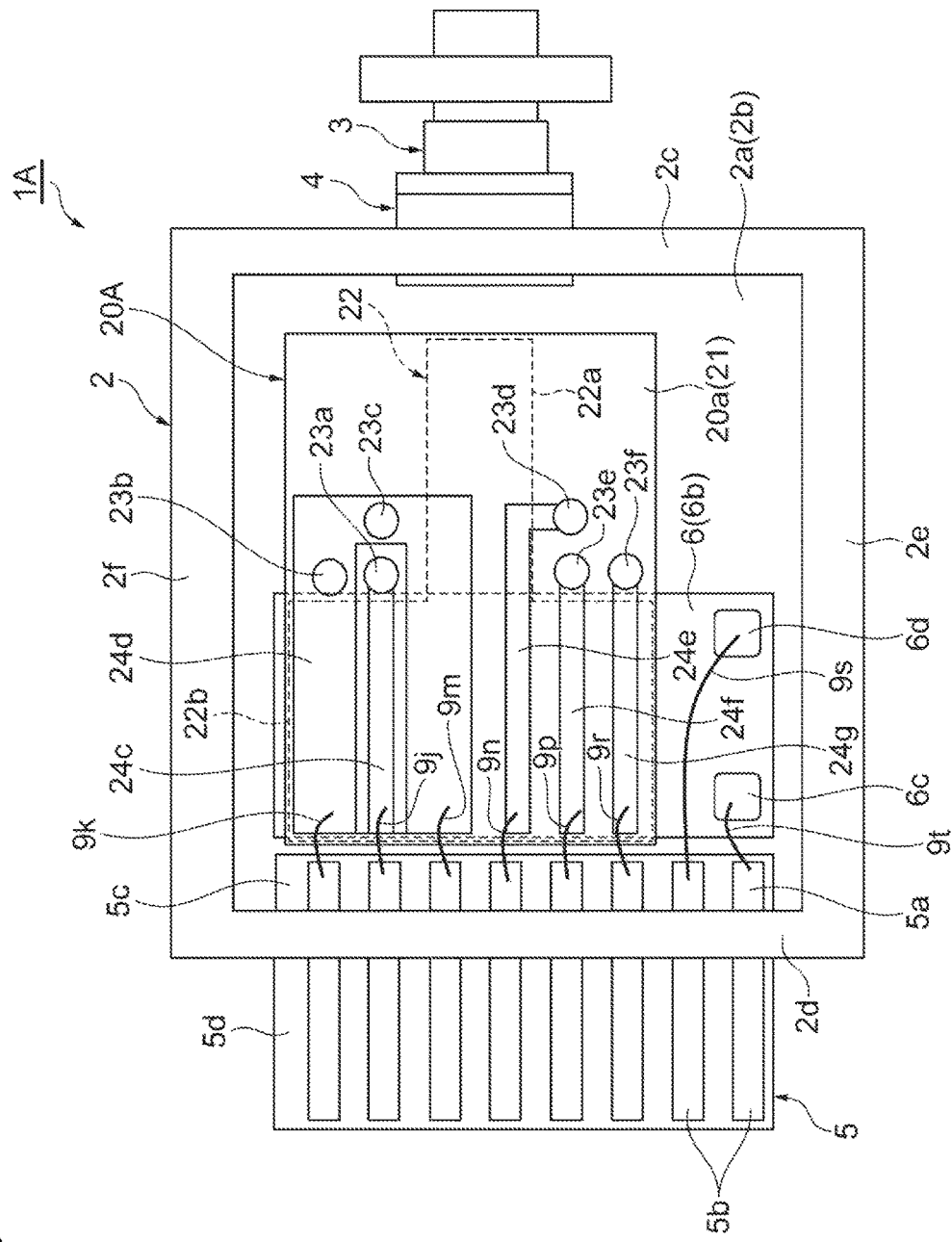
FIG. 9 is a diagram showing the method of assembling the optical transmitter device.

Subsequently, as shown in FIG. 8, the TEC 6 is mounted on the back surface 20b of the carrier 20A, and the carrier 20A is turned over and is mounted on the TEC 6 in the housing 2. The bonding wires 9j to 9t are then connected thereto. Afterwards, as shown in FIG. 9, optical axis adjustment for the coupling unit 3 is performed while the optical integrating device 11 is made emit laser light, and the coupling unit 3 and the lens holder 4 are then joined to each other. Finally, the lid 2g is joined to the top ends of the front wall 2c, the rear wall 2d, and the pair of side walls 2e and 2f. Thus, the optical transmitter device 1A of this embodiment is completed.

The advantageous effects of the above-described optical transmitter device 1A of this embodiment will now be described. In the optical transmitter device 1A, both the optical integrating device 11 and the TEC 6 are provided on the back surface 20b of the carrier 20A. Accordingly, compared with the case where the carrier is mounted on the TEC, and the optical integrating device is mounted on the carrier, the height of the optical transmitter device 1A (the length in the direction A3) can be reduced by the height of at least the optical integrating device and the chip carrier. Further, the carrier 20A includes the plate-like metal plate 22, and the metal plate 22 includes the extension 22a overlapping with the optical integrating device 11 when viewed from the direction A3, and the base 22b overlapping with the TEC 6 when viewed from the direction A3, thereby advantageously achieving thermal bonding between the optical integrating device 11 and the TEC 6; thus, the temperature of the optical integrating device 11 can be accurately controlled.

The metal plate 22 can be made of metal material. This configuration imparts adequate mechanical strength to the carrier 20A so that the laser assembly 30 including the optical integrating device 11 and the lens 7 can be stably supported even in the case where the carrier 20A is supported by the TEC 6 only.

The carrier 20A may include, in the auxiliary areas 22c other than the region where the metal plate 22 is provided, the via 23a passing through between the top surface 20a and the back surface 20b and establishing an electrical connection between the interconnection 24c and the optical integrating device 11. The carrier 20A may include other vias 23b to 23f in the auxiliary areas 22c other than the region where the metal plate 22 is provided. This configuration advantageously establishes an electrical connection between each of the interconnections 24c to 24g provided on the top surface 20a of the carrier 20A, and the optical integrating device 11 and the thermistor 28 provided on the back surface 20b of the carrier 20A.

Figure 10A:
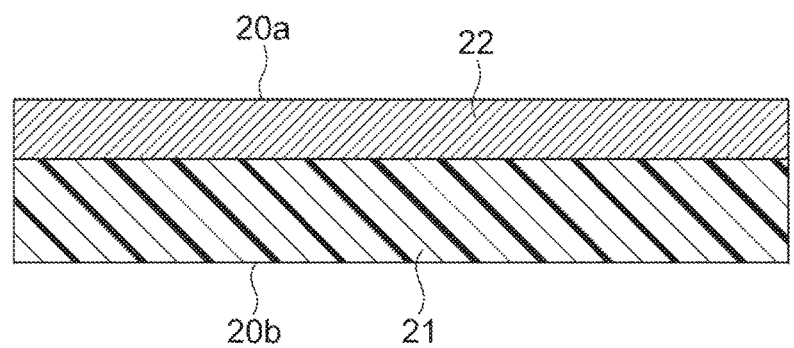
FIGS. 10A and 10B are sectional views of carriers showing example positions of a metal plate.
Figure 10B:
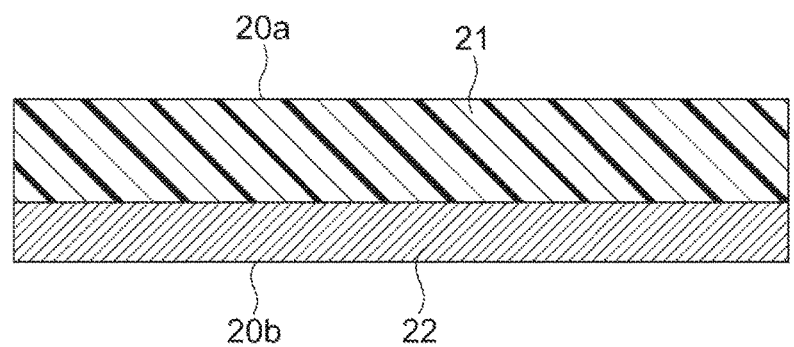

Although the metal plate 22 is provided between the insulating slabs 21 in the example shown in FIG. 2, the metal plate 22 may be located in another position. For example, as shown in FIG. 10A, the metal plate 22 may be provided on the top surface of the insulating slab 21. Alternatively, as shown in FIG. 10B, the metal plate 22 may be provided on the back surface of the insulating slab 21. If the metal plate 22 is disposed in at least one of the spots: in the insulating slab 21, on the top surface, and on the back surface, the carrier 20A can be advantageously implemented.

[First Modification]

Figure 11:
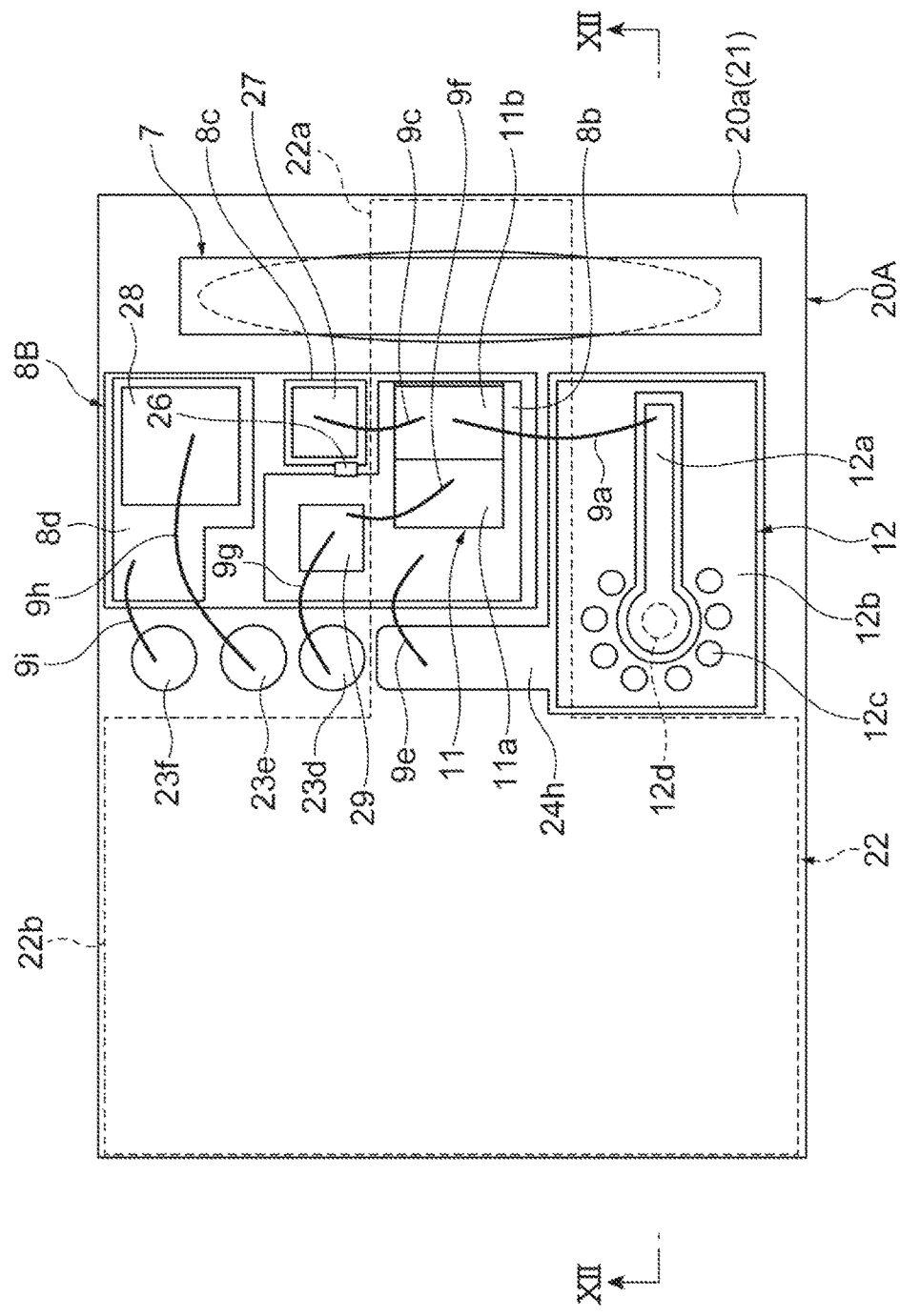
FIG. 11 is a bottom view showing the configuration on the back surface of a carrier according to a first modification.
Figure 12:
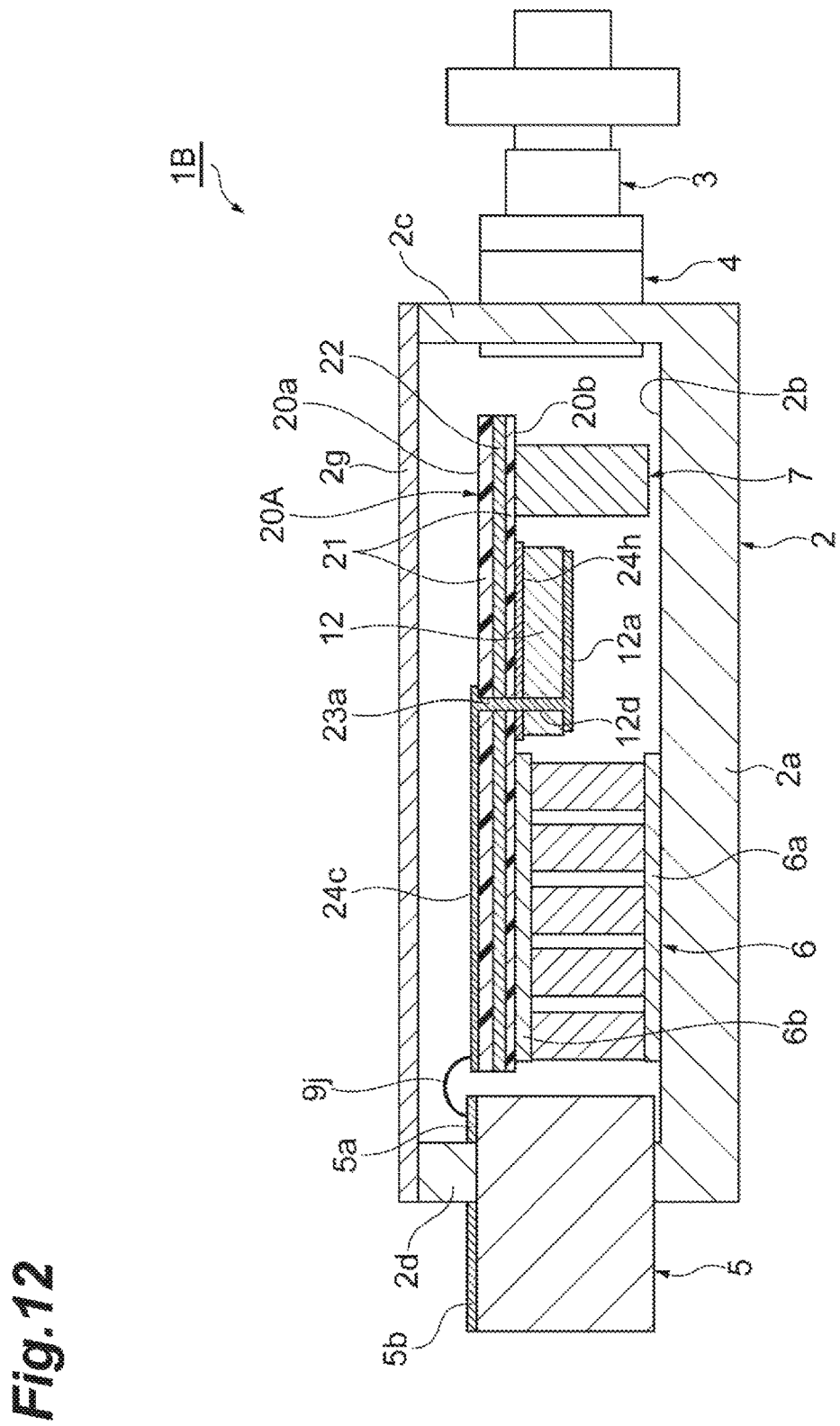
FIG. 12 is a sectional view of the optical transmitter device according to the first modification, including a sectional configuration along line XIII-XIII in FIG. 11.

FIG. 11 is a bottom view showing the configuration on the back surface 20b of the carrier 20A according to the first modification of the above-described embodiment. FIG. 12 is a sectional view of the optical transmitter device 1B according to the first modification, including a sectional configuration along line XII-XII in FIG. 11. This modification differs from the above-described embodiment in the configuration of the chip carrier. In other words, unlike the chip carrier 8A of the above-described embodiment, the chip carrier 8B of this modification does not include a high-frequency transmission line including the metal pattern 8a. The optical transmitter device 1B of this modification includes a wiring substrate 12 mounted on the back surface 20b of the carrier 20A, instead. The wiring substrate 12 is a generally rectangular parallelepiped, is an insulating member, and has a longitudinal direction along the direction A1. In this modification, the wiring substrate 12 is disposed adjacent to one side of the carrier 20A (the end on the side wall 2f side) and alongside the chip carrier 8B in the direction A2. The main surface of the wiring substrate 12 is generally flush with the main surface of the chip carrier 8B. In addition, the wiring substrate 12 of this modification is populated on the interconnection 24h provided on the back surface 20b of the carrier 20A. The interconnection 24h is electrically connected to the interconnection 24d through the vias 23b and 23c shown in FIG. 4. In this modification, the bonding wire 9e establishes a connection between the interconnection 24h and the metal pattern 8b.

The wiring substrate 12 includes a metal pattern 12a, a metal pattern 12b, a plurality of ground vias 12c, and a signal via 12d. The metal pattern 12a and the metal pattern 12b are formed on the main surface of the wiring substrate 12. The metal pattern 12a is a signal transmission line for transmitting high-frequency signals and extends in the direction A1 in the region sandwiched between the metal pattern 12b, which is a reference potential (GND) pattern. The signal via 12d is a waveguide transmission line for transmitting high-frequency signals and passes through between the main surface and the back surface of the wiring substrate 12 in the region surrounded by the plurality of ground vias 12c which serves as reference potential (GND) wiring. One end of the signal via 12d is electrically connected to the top plate electrode of the modulator element 11b through the metal pattern 12a and the bonding wire 9a. In addition, the other end of the signal via 12d is electrically connected to the interconnection 24c through the via 23a. The end of each ground via 12c is electrically connected to the metal pattern 12b. The other end of each ground via 12c is electrically connected to the interconnection 24d through the interconnection 24h and the vias 23b and 23c.

As in this modification, the optical transmitter device may further include the wiring substrate 12 that includes a waveguide transmission line (signal via 12d) and is mounted on the back surface 20b of the carrier 20A. One end of the waveguide transmission line may be electrically connected to the optical integrating device 11 through the bonding wire 9a, and the other end of the waveguide transmission line may be electrically connected to the interconnection 24c of the carrier 20A. This configuration shortens the bonding wire 9a between the optical integrating device 11 and the interconnection 24c of the carrier 20A and increases the high-frequency properties.

[Second Modification]

Figure 13:
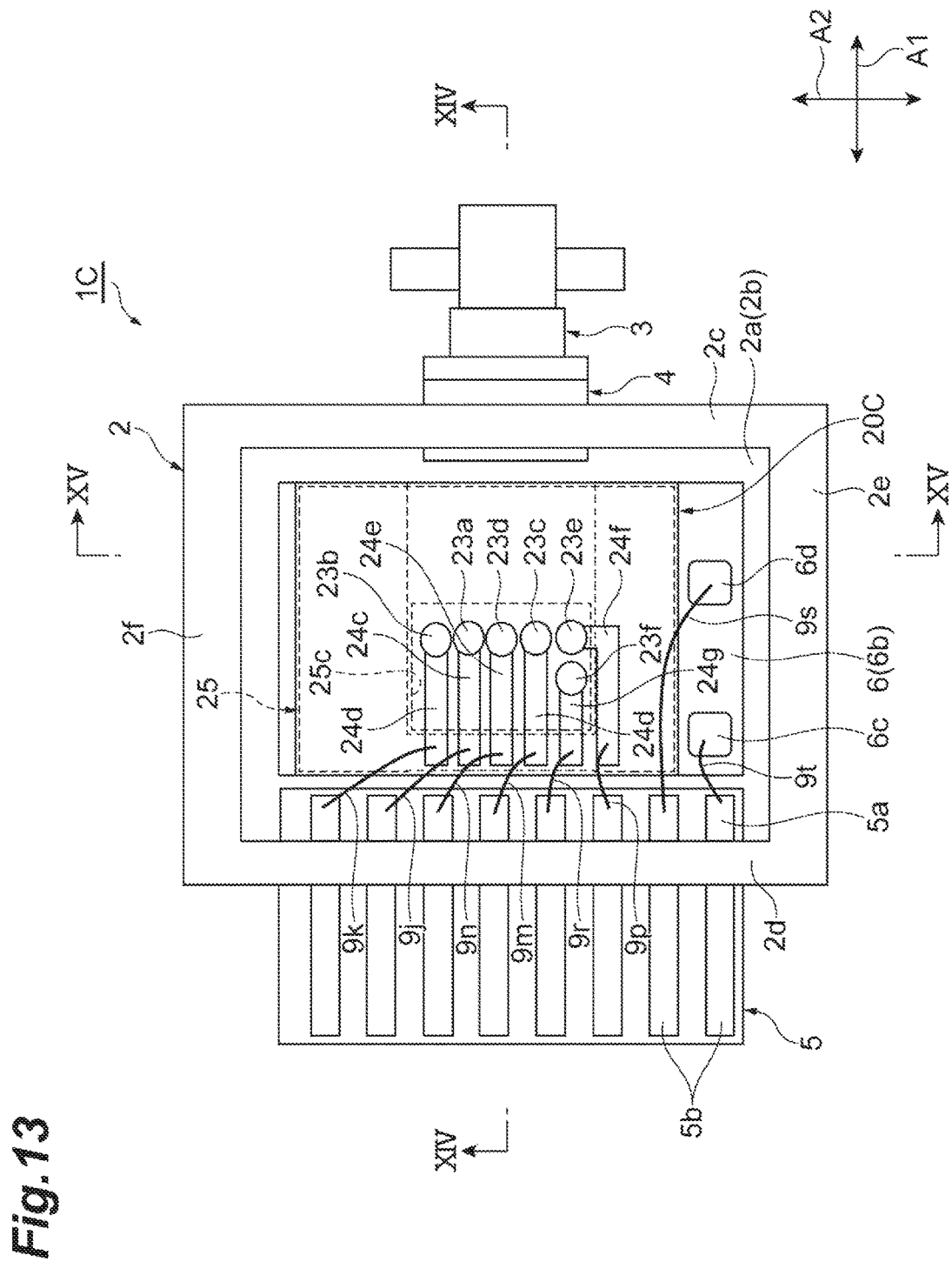
FIG. 13 is a top view of the optical transmitter device according to a second modification.
Figure 14:
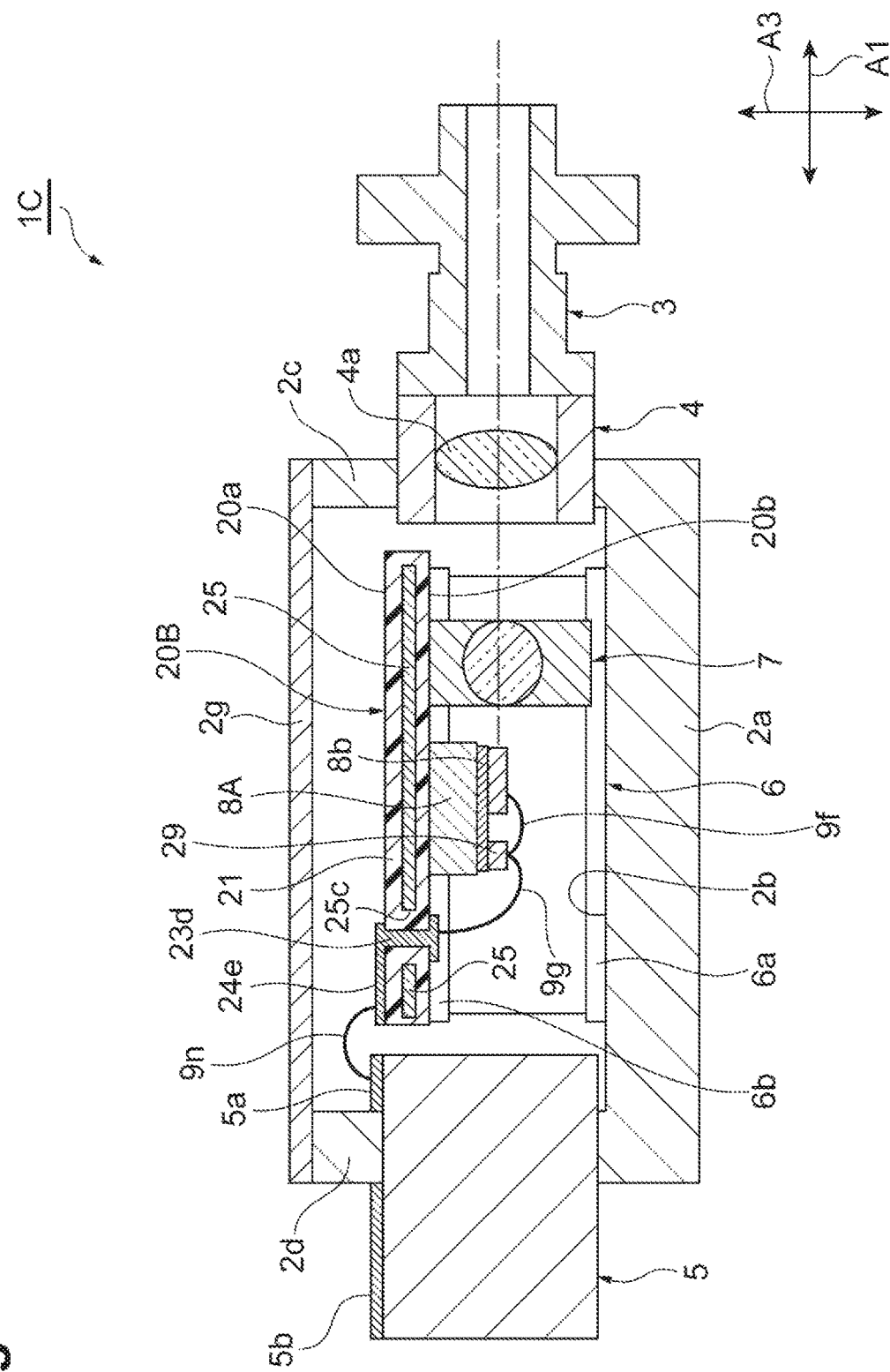
FIG. 14 is a sectional view of the optical transmitter device along line XIV-XIV of the optical transmitter device shown in FIG. 13.
Figure 15:
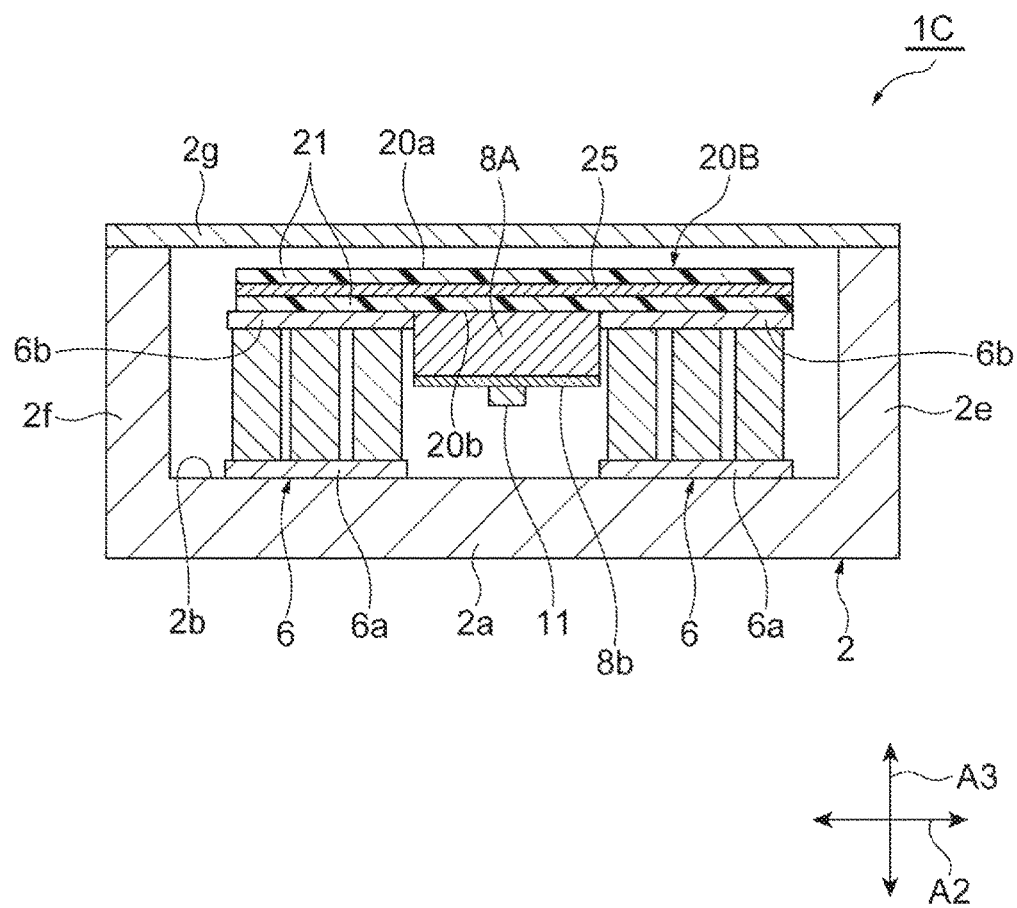
FIG. 15 is a sectional view of the optical transmitter device along line XV-XV of the optical transmitter device shown in FIG. 13.
Figure 16:
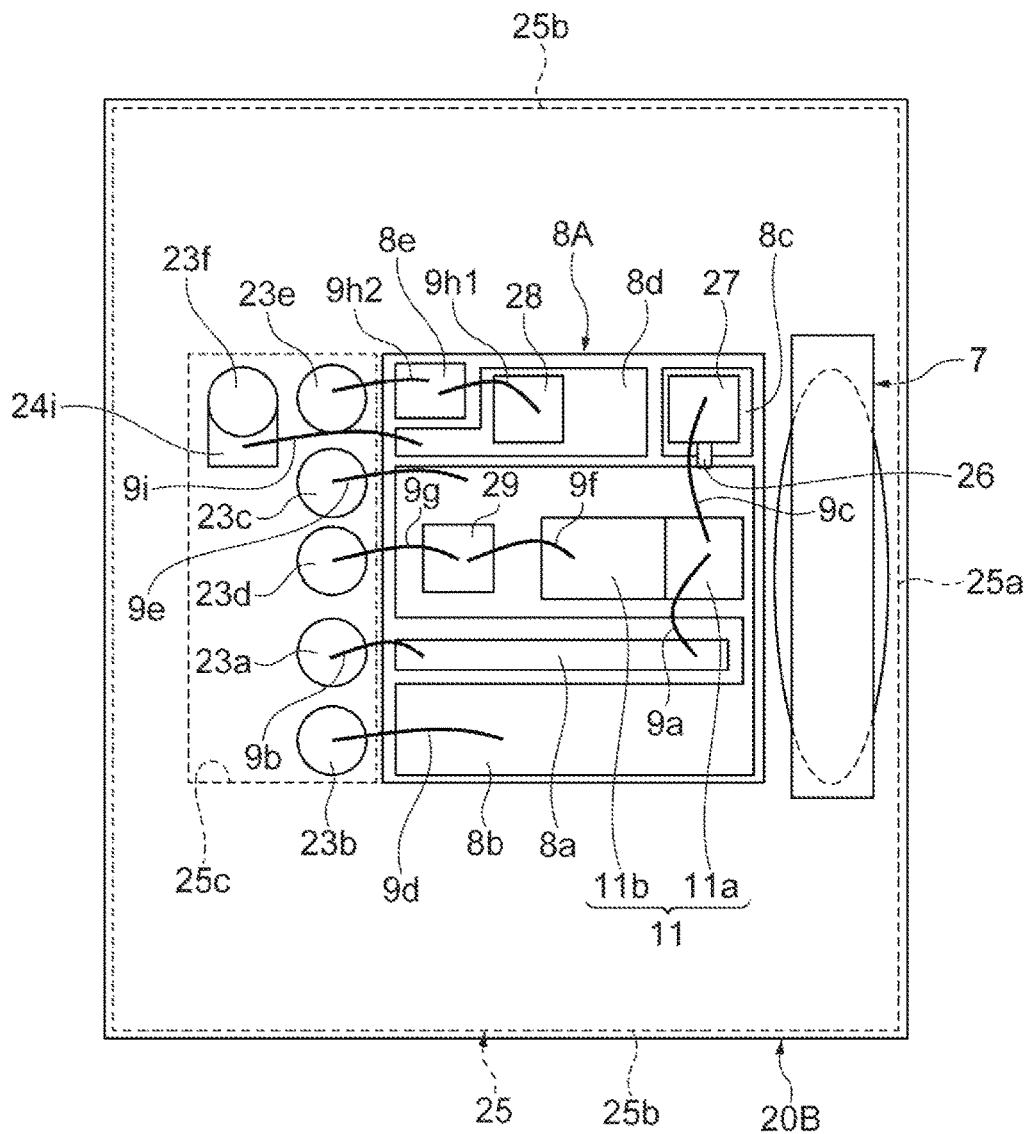
FIG. 16 is a bottom view showing the configuration viewed from the back surface of a carrier.

FIG. 13 is a top view of the optical transmitter device 1C according to the second modification of the above-described embodiment. FIG. 14 is a sectional view of the optical transmitter device 1C along line XIV-XIV of the optical transmitter device 1C shown in FIG. 13. FIG. 15 is a sectional view of the optical transmitter device 1C along line XV-XV of the optical transmitter device 1C shown in FIG. 13. FIG. 16 is a bottom view showing the configuration on the back surface 20b of the carrier 20B included in the optical transmitter device 1C. In this modification, the positions of the optical integrating device 11 and the TEC 6 and the shape of the metal plate are different from those in the above-described embodiment.

Figure 17:
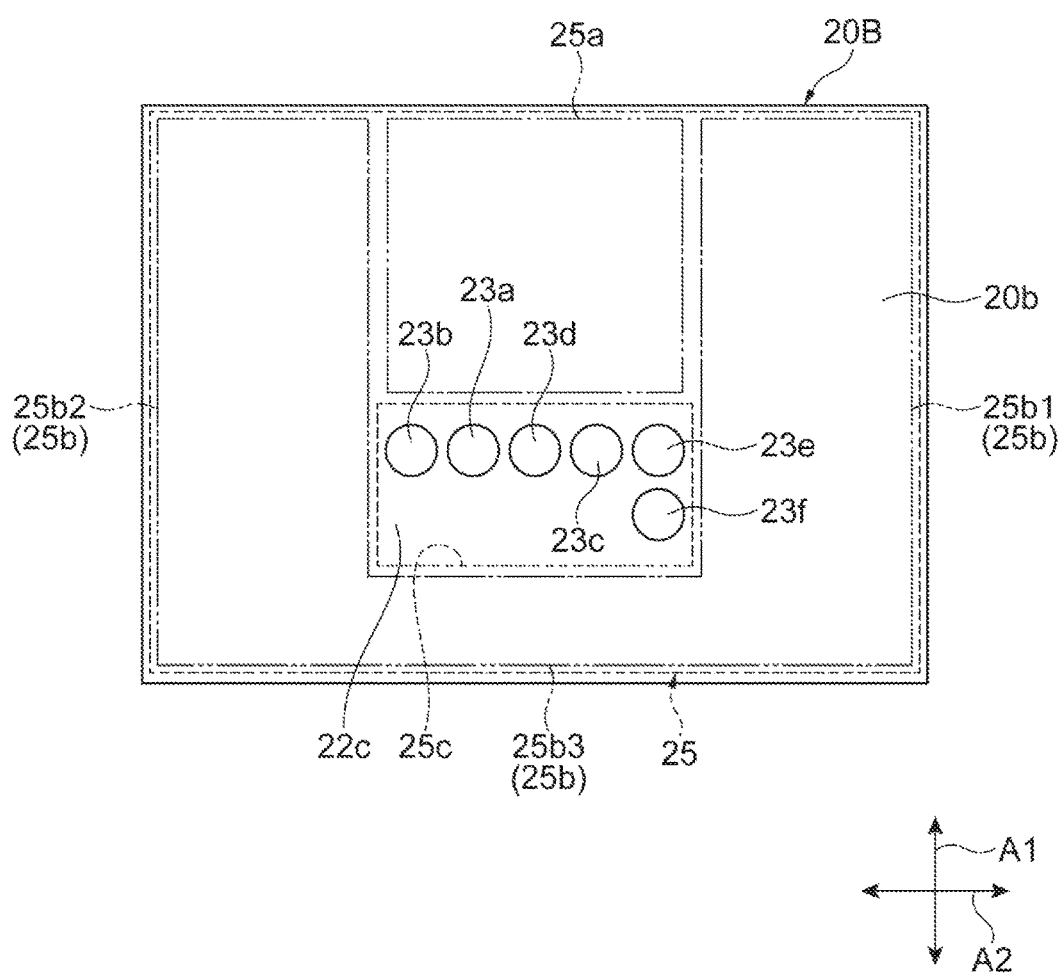
FIG. 17 is a diagram showing the back surface of a carrier according to the second modification.

FIG. 17 is a diagram showing the back surface 20b of the carrier 20B (note that the interconnections 24c to 24g are omitted in the drawing). As shown in FIG. 17, the carrier 20B of this modification includes a metal plate 25 instead of the metal plate 22 of the above-described embodiment. The metal plate 25 includes an extension 25a and a base 25b. In this modification, the metal plate 25 has the base 25b on both sides of the extension 25a. To be specific, a section 25b1, which is a part of the base 25b, the extension 25a, and a section 25b2, which is another part of the base 25b, are arranged in this order along the direction A2. Further, the base 25b includes a section 25b3 bridging the section 25b1 and the section 25b2 on the rear side of the extension 25a. In other words, the metal plate 25 of this modification has a cornered ring shape in which an opening 25c is located in the central portion of the carrier 20B.

The vias 23a to 23f are provided in the auxiliary area 22c (opening 25c) of the carrier 20B other than the region where the metal plate 25 is provided. In this modification, the vias 23a to 23f are provided in the auxiliary area 22c surrounded by the extension 25a and the base 25b. Accordingly, the vias 23a to 23f can be formed without interference from the metal plate 25.

As shown in FIG. 16, when viewed from the direction A3, the optical integrating device 11 and the extension 25a overlap with each other. In other words, the region where the optical integrating device 11 is projected toward the back surface 20b overlaps with the region where the extension 25a is projected toward the back surface 20b. Accordingly, the optical integrating device 11 is thermally bonded to the metal plate 25 at the extension 25a. In this modification, the chip carrier 8A on which the optical integrating device 11, the capacitors 27 and 29 and the thermistor 28 are mounted overlaps with the extension 25a when viewed from the direction A3. The extension 25a may further overlap with the lens 7 when viewed from the direction A3. In addition, as shown in FIG. 13, when viewed from the direction A3, the TEC 6 and the base 25b overlap with each other. Accordingly, the TEC 6 is thermally bonded to the metal plate 25 at the base 25b. The TEC 6 of this modification has a planar shape conforming to the shape of the base 25b. In other words, the TEC 6 has such a structure that the extension 25a is sandwiched therebetween.

As in this modification, the TEC 6 may have such a structure that the extension 25a is sandwiched therebetween in the direction A1 and, in the metal plate 25, the base 25b may be provided on both sides of the extension 25a. This configuration shortens the length of the optical transmitter device in the direction A1.

As in this modification, the chip carrier 8A may further include a metal pattern 8e, and the top plate electrode of the thermistor 28 may be connected to the via 23e through the bonding wire 9h1, the metal pattern 8e, and the bonding wire 9h2.

[Third Embodiment]

Figure 18:
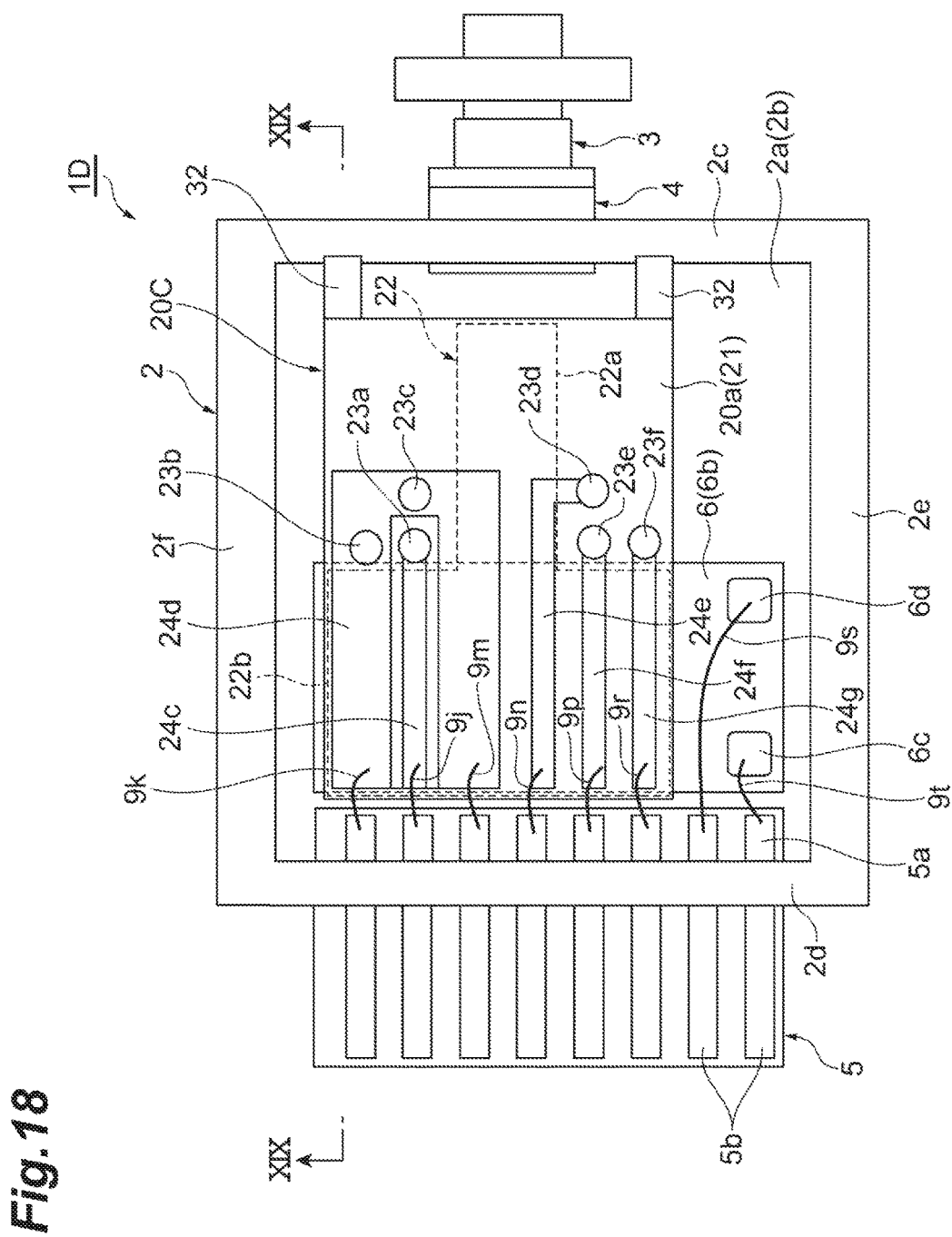
FIG. 18 is a top view of the optical transmitter device according to a third modification.
Figure 19:
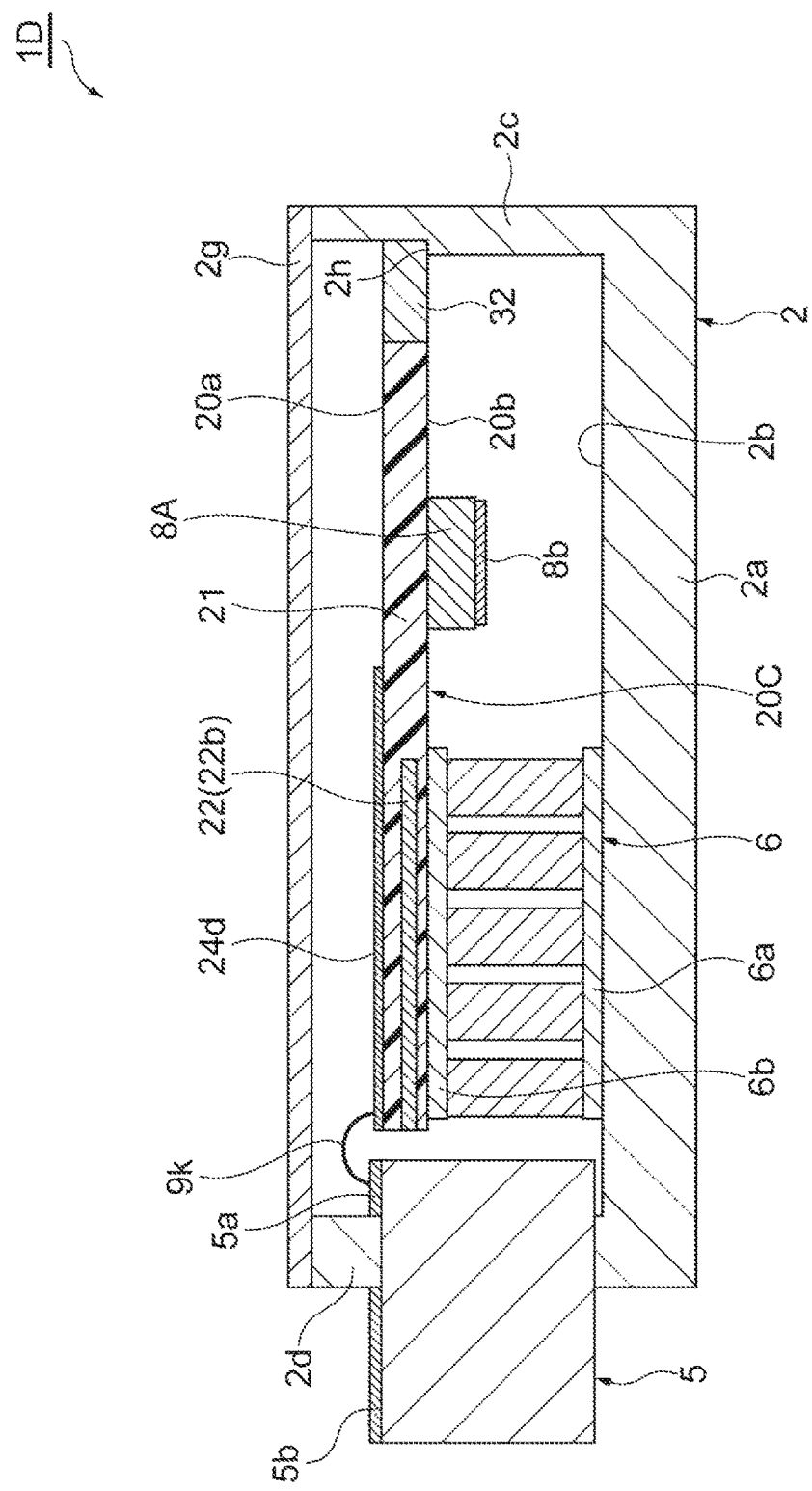
FIG. 19 is a sectional view of the optical transmitter device along line XIX-XIX of the optical transmitter device shown in FIG. 18.

FIG. 18 is a top view of an optical transmitter device 1D according to the third modification of the above-described embodiment. FIG. 19 is a sectional view of the optical transmitter device 1D along line XIX-XIX of the optical transmitter device 1D shown in FIG. 18. This optical transmitter device 1D includes a carrier 20C instead of the carrier 20A of the above-described embodiment. The carrier 20C has the same configuration as the carrier 20A except that it further includes a pair of lockers 32. The pair of lockers 32 is integrally provided to the insulating slab 21 at the edge of the carrier 20C, has lower thermal conductivity than the insulating slab 21, and provides fixation between the edge of the insulating slab 21 and the housing 2. In one example, the lockers 32 are composed of a material, such as $SiO_2$, epoxy resin, or acrylic resin, and are integrated with the insulating slab 21 by sintering. The heat-transfer coefficient of the lockers 32 is 0.200 to 1.050 W/(m·K), for example. In this modification, a step 2h is formed on at least one of the front wall 2c and the pair of side walls 2e and 2f of the housing 2, and the edge of each locker 32 is supported by the step 2h.

The configuration of this modification imparts high mechanical strength to the carrier so that the laser assembly including the optical integrating device 11 and the lens 7 can be stably supported compared with the case where the carrier is supported by the TEC 6 only.

The optical transmitter device of the present invention is not limited to the above-described embodiments and various other modifications can be made. For example, the above-described embodiments can be combined depending on the intended use or effects. Further, the metal plate of the present invention is not limited to the shapes mentioned in above-described embodiments and modifications, and may have other various shapes including an extension and a base.

What is claimed is:

1. An optical transmitter device, comprising:
   an optical integrating device;
   a carrier having a top surface and a back surface opposite to the top surface, the carrier including an insulating slab and a metal plate attached to the insulating slab, the metal plate having a thermal conductivity better than a thermal conductivity of the insulating slab, the insulating slab forming the top surface of the carrier and providing an interconnection thereon, the back surface mounting the optical integrating device thereon; and
   a thermo-electric cooler (TEC) facing the carrier and mounting the carrier thereon,
   wherein the carrier has a base overlapped with the TEC and an extension not overlapped with the TEC, the extension mounting the optical integrating device thereon.
2. The optical transmitter device according to claim 1, wherein the optical integrating device has an optical axis along which the extension extends from the base, and
   wherein the extension has a width narrower than a width of the base, where the width of the extension and the width of the base are measured along a direction perpendicular to the optical axis.
3. The optical transmitter device according to claim 2, further comprising a housing that encloses the optical integrating device and the carrier therein, wherein the carrier provides an end opposite to the base thereof, the end being fixed with the housing through a locker.
4. The optical transmitter device according to claim 1, wherein the base includes a stein and two branches each extending from the stein, the extension being put between the two branches.
5. The optical transmitter device according to claim 4, wherein the carrier provides a via that electrically connects the interconnection in the top surface thereof with the optical integrating device on the back surface, and
   wherein the metal plate is removed in a portion providing the via.
6. The optical transmitter device according to claim 1, wherein the metal plate forms the back surface of the carrier.
7. The optical transmitter device according to claim 1, wherein the back surface of the carrier mounts the optical integrating device through a chip carrier.
8. The optical transmitter device according to claim 7, wherein the chip carrier mounts a capacitor, a terminator, and a thermistor thereon.
9. The optical transmitter device according to claim 1, wherein the carrier further provides another insulating slab attached to the metal plate, the insulating slab and the another insulating slab sandwiching the metal plate, the another insulating slab being attached to the TEC and forming the back surface of the carrier.
10. The optical transmitter device according to claim 9, wherein the another insulating slab provides another interconnection thereon, and
    wherein the carrier further provides an auxiliary area except for the base and the extension, the auxiliary area providing a via that electrically connects the interconnection on the top surface of the carrier with the another interconnection on the back surface of the carrier.
11. The optical transmitter device according to claim 1, wherein the carrier further mounts a wiring substrate on the back surface thereof, and
    wherein the optical integrating device is provided with a driving signal through the wiring substrate.
12. The optical transmitter device according to claim 1, wherein the optical integrating device includes a semiconductor laser diode (LD) driven in a DC mode and a semiconductor modulator driven in an AC mode, the semiconductor modulator being integrated with the LD and driven by a driving signal carried by the interconnection on the top surface of the carrier.
13. The optical transmitter device according to claim 1, wherein the top surface of the carrier only mounts the interconnection thereon.

* * * * *